US008864957B2

(12) United States Patent
Ramanathan et al.

(10) Patent No.: US 8,864,957 B2
(45) Date of Patent: Oct. 21, 2014

(54) VANADIUM OXIDE THIN FILMS

(75) Inventors: Shriram Ramanathan, Acton, MA (US); Dmitry Ruzmetov, Gaithersburg, MD (US); Venkatesh Narayanamurti, Boston, MA (US); Changhyun Ko, Cambridge, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 232 days.

(21) Appl. No.: 12/990,196

(22) PCT Filed: Apr. 28, 2009

(86) PCT No.: PCT/US2009/041988
§ 371 (c)(1),
(2), (4) Date: Jan. 25, 2011

(87) PCT Pub. No.: WO2009/134810
PCT Pub. Date: Nov. 5, 2009

(65) Prior Publication Data
US 2011/0120855 A1    May 26, 2011

Related U.S. Application Data

(60) Provisional application No. 61/048,308, filed on Apr. 28, 2008, provisional application No. 61/080,448, filed on Jul. 14, 2008.

(51) Int. Cl.
*C23C 14/08* (2006.01)
*C23C 14/54* (2006.01)
*C23C 14/58* (2006.01)
*C23C 14/00* (2006.01)
*H01L 49/00* (2006.01)

(52) U.S. Cl.
CPC ........... *C23C 14/083* (2013.01); *C23C 14/58* (2013.01); *C23C 14/541* (2013.01); *C23C 14/0036* (2013.01); *H01L 49/003* (2013.01)
USPC ........... 204/192.15; 204/192.11; 204/192.34; 505/475

(58) Field of Classification Search
CPC ........................... C23C 14/083; C23C 14/541
See application file for complete search history.

(56) References Cited

U.S. PATENT DOCUMENTS

| 3,669,861 | A | * | 6/1972 | Cash et al. | 204/192.34 |
| 4,912,087 | A | * | 3/1990 | Aslam et al. | 505/475 |
| 6,413,386 | B1 | * | 7/2002 | Callegari et al. | 204/192.23 |
| 6,562,715 | B1 | * | 5/2003 | Chen et al. | 438/643 |
| 2006/0249372 | A1 | * | 11/2006 | Xiang et al. | 204/192.11 |

* cited by examiner

*Primary Examiner* — Keith Hendricks
*Assistant Examiner* — Timon Wanga
(74) *Attorney, Agent, or Firm* — Elizabeth Kim Patent Law Offices LLC

(57) ABSTRACT

Thin films of vanadium oxide having exceptionally high metal-insulator transition properties are synthesized by RF sputtering. An Al2O3 substrate is placed in a sputtering chamber and heated to a temperature up to about 550 degrees Celsius. Ar and O2 gases are introduced into the sputtering chamber at the flow values of about 92.2 sccm and about 7.8 sccm respectively. A voltage is applied to create a plasma in the chamber. A sputtering gun with vanadium target material is ignited and kept at a power of about 250 W. The phase transition parameters of vanadium dioxide thin films, synthesized by RF sputtering, are modulated by exposing the vanadium dioxide thin film to UV (ultraviolet) radiation so as to induce a change in oxygen incorporation of the vanadium dioxide thin film.

9 Claims, 8 Drawing Sheets

US 8,864,957 B2

VANADIUM OXIDE THIN FILMS

CROSS-REFERENCE TO RELATED APPLICATIONS

This application is based upon, and claims the benefit of priority under 35 U.S.C. §119(e) from U.S. Provisional Patent Application Ser. No. 61/048,308 (the "'308 provisional application"), filed Apr. 28, 2008, entitled "Vanadium Dioxide Thin Films," and from U.S. Provisional Patent Application Ser. No. 61/080,448 (the "'448 provisional application"), filed Jul. 14, 2008, entitled "Vanadium Oxide Thin Films," The contents of both the '308 provisional application and the '448 provisional application are incorporated herein by reference in their entireties as though fully set forth.

STATEMENT REGARDING FEDERALLY SPONSORED RESEARCH

This invention was made with government support under grant PHY-0601184, awarded by the National Science Foundation. The government has certain rights in the invention.

BACKGROUND

Metal-insulator transitions in strongly correlated oxides such as vanadium dioxide ($VO_2$) are of much scientific and technological interest. Due to the presence of multiple oxidation states, the synthesis of high-quality $VO_2$ films having desired phase transition characteristics such as large jumps in phase transition resistance, is a challenge.

Vanadium dioxide ($VO_2$) is a strongly correlated electron compound that exhibits a dramatic metal-insulator transition (MIT) upon temperature decrease. The MIT occurs close to room temperature. $VO_2$ has been heavily researched because of its relevance to the basic science of metal-insulator transitions. In addition, $VO_2$ is of much interest for applications in electronics, including but not limited to the fabrication of switches, electro-optic devices, and infra-red detectors used in applications such as the defense industry.

An active area of research has thus been to develop high-quality $VO_2$ crystals and thin films, for purposes of understanding their fundamental physical properties, as well as to obtain large changes in the electrical resistance across the phase transition boundary so that high-performance devices can be made. Typically, thin films show less impressive electrical properties compared to single crystals, partly due to the difficulty of synthesizing phase pure $VO_2$ arising from the existence of multiple valence states of V. For practical applications, for example electronics and optoelectronics applications, vanadium oxide thin film structures are more convenient than single crystals.

For these reasons, methods and systems for synthesizing very high quality $VO_2$ thin films with strong MIT properties and sharp phase transition characteristics are very desirable.

BRIEF DESCRIPTION OF THE DRAWINGS

The drawings disclose illustrative embodiments. They do not set forth all embodiments. Other embodiments may be used in addition or instead. Details that may be apparent or unnecessary may be omitted to save space or for more effective illustration. When the same numeral appears in different drawings, it refers to the same or like components or steps.

DETAILED DESCRIPTION

The present disclosure describes methods and systems for synthesizing very high quality $VO_2$ thin films that exhibit strong MIT properties and sharp phase transition characteristics, for high-performance electronic devices. In particular, the synthesis of $VO_2$ thin films by RF sputtering is described. In one or more embodiments, methods and systems of synthesizing $VO_2$ thin films that exhibit a resistance change of about four orders of magnitude or more across the phase transition boundary is described. The properties of the synthesized $VO_2$ thin films, and the influence of factors such as the sample synthesis conditions, device sizes, and substrate choice on the parameters of the MIT (metal insulator transition) are also investigated and described.

The present disclosure also describes systems and methods of using ultra-violet (UV) irradiation to modulate, at relatively low temperatures, the resistance ratio as well as the resistance across the metal-insulator transition. The enhanced oxygen incorporation due to creation of excited oxygen species allows for controllably tunable stoichiometry.

Illustrative embodiments are now discussed. Other embodiments may be used in addition or instead.

I. Synthesis of $VO_2$ Thin Films

The present disclosure describes the synthesis of very high quality $VO_2$ thin films by RF sputtering from a $VO_2$ target. The present disclosure also describes the influence of sample synthesis conditions, device sizes, and substrate choice on the parameters of the MIT. Electrical measurements of the MIT are used as a main characterization criterion for thin film quality.

In one or more embodiments of the present disclosure, single stoichiometric phase, polycrystalline $VO_2$ thin (50 nm) films have been synthesized by RF sputtering from a $VO_2$ target. Sputtering from a $VO_2$ target, as compared to typical reactive V sputtering, has an advantage of the stability of the deposited $VO_2$ stoichiometry being determined mainly by the V-O stoichiometry in the sputtering target. This allows maintaining the $VO_2$ phase in a wider range of sputtering conditions which can be used to create VO2 films of different morphology.

Figure 1:
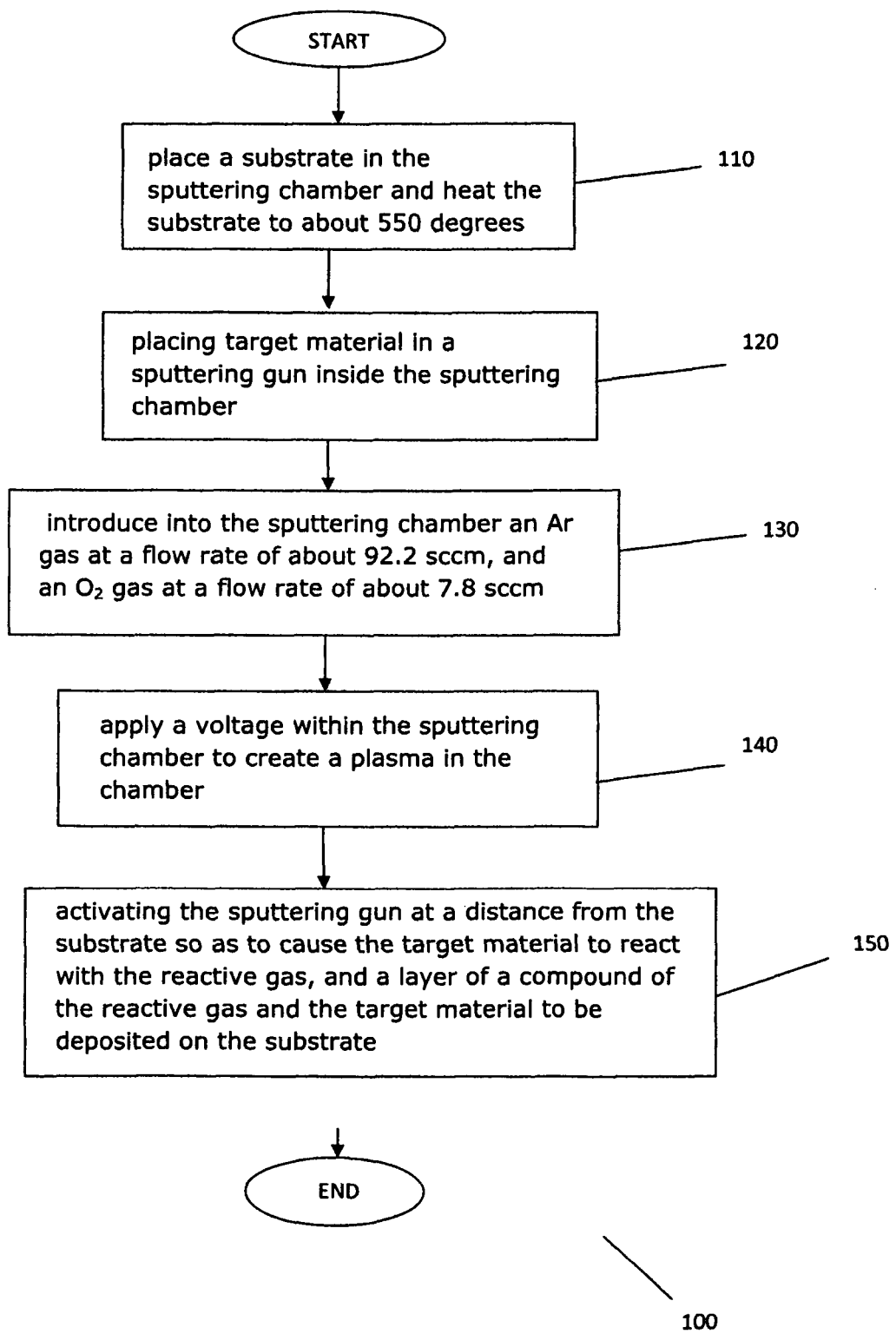
FIG. 1 illustrates a schematic flow chart of a method of synthesizing a $VO_2$ thin film, in one embodiment of the present disclosure.

FIG. 1 illustrates a schematic flow chart of a method 100 of synthesizing a $V_{O2}$ thin film by reactive sputtering on c-plane sapphire substrates. In overview, the method 100 includes an act 110 of placing a substrate, for example an $Al_2O_3$ substrate, in a sputtering chamber and heating the substrate to a substrate temperature. The method further includes an act 120 of placing target material, for example $VO_2$ as in the illustrated embodiment, in a sputtering gun inside the sputtering chamber. The method further includes an act 130 of introducing into the sputtering chamber an inert gas at a first flow rate, then a reactive gas at a second flow rate. The method further includes an act 140 of applying a voltage within the sputtering chamber so as to create a plasma within the sputtering chamber. The method further includes an act 150 of activating the sputtering gun at a distance from the substrate so as to cause the crystal oxide in the target to react with the reactive gas, and so as to cause a layer of a compound of the reactive gas and the crystal oxide to be deposited on the substrate.

Figure 2:
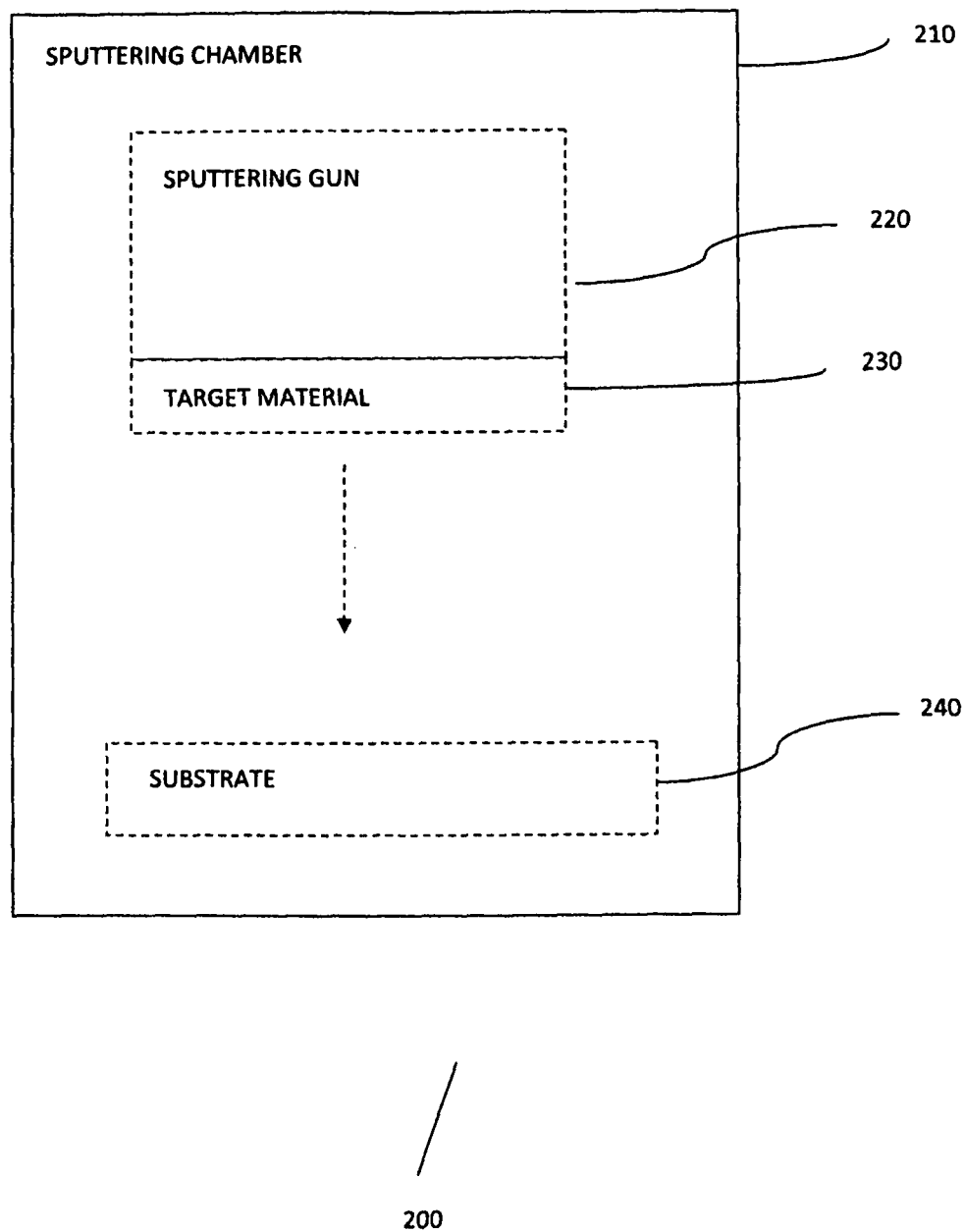
FIG. 2 illustrates a schematic block diagram of a system for synthesizing a $VO_2$ thin film, in one embodiment of the present disclosure.

FIG. 2 illustrates a schematic block diagram of a system 200 for synthesizing a $VO_2$ thin film, in one embodiment of the present disclosure. In overview, the system 200 includes a substrate 240 heatable to a substrate temperature. The system 200 further includes a sputtering chamber 210 configured to receive a flow of an inert gas at a first flow rate and a flow of a reactive gas at a second flow rate, so that a plasma is created within the sputtering chamber upon application of a voltage within the sputtering chamber 210. The system 200 further includes a sputtering gun 220 having a target material 230 placed thereon. The sputtering gun 220, when activated in the chamber at a distance from the substrate, is configured to induce the target material to react with the reactive gas, thereby causing a layer of a compound of the reactive gas and the target material to be deposited on the substrate. This creates a thin film that undergoes an MIT at an MIT temperature, with a change in resistance of the target material of at least four orders of magnitude, as described further in conjunctions with FIG. 3 and FIG. 4 below.

In one or more embodiments of the present disclosure, the substrate is $Al_2O_3$ substrate, which is placed in a vacuum sputtering chamber having a base pressure of about be −8 Torr to about $3 \times 10^{-8}$ Torr. In these embodiments, the substrate may be heated up to about 550° C., and/or kept at an elevated temperature of between about 300° C. and 550° C. during sputtering.

In one or more embodiments, the target material is vanadium. A vanadium target of 99.9% purity may be placed in a DC sputtering gun approximately 6 inches away from the substrate. A reactive environment is created for sputtering using Ar and $O_2$ gases admitted into the sputtering chamber at the flow values of about 92.2 sccm and about 7.8 sccm respectively. Gas flow may be precisely controlled by mass flow controllers, in order to obtain the right ratio of vanadium to oxygen and proper deposition conditions.

In one or more embodiments, the substrate is kept at 550 degrees C. for 20 min. Then plasma cleaning of the sample surface is done which also creates ionized particles in the chamber and facilitates the future gun ignition.

During the plasma cleaning a negative voltage is applied to the sample holder with the substrate which created plasma. In these embodiments, the applied power may be about 25 W. Next, the DC gun with the vanadium target may be ignited and kept at a power of about 250 W.

Pre-sputtering may be done for 5 min with a gun shutter closed. The vanadium sputtering for 30 min deposits a 100 nm thick $VO_2$ film on the substrate. The sample may be let to cool down to approximately 150 degrees C. inside the chamber for about 30 min, then transported to the load lock which is brought to atmospheric pressure using pure nitrogen. The sample may be let to cool down to room temperature in nitrogen for 1 hour and then taken out of the load lock.

Figure 3:
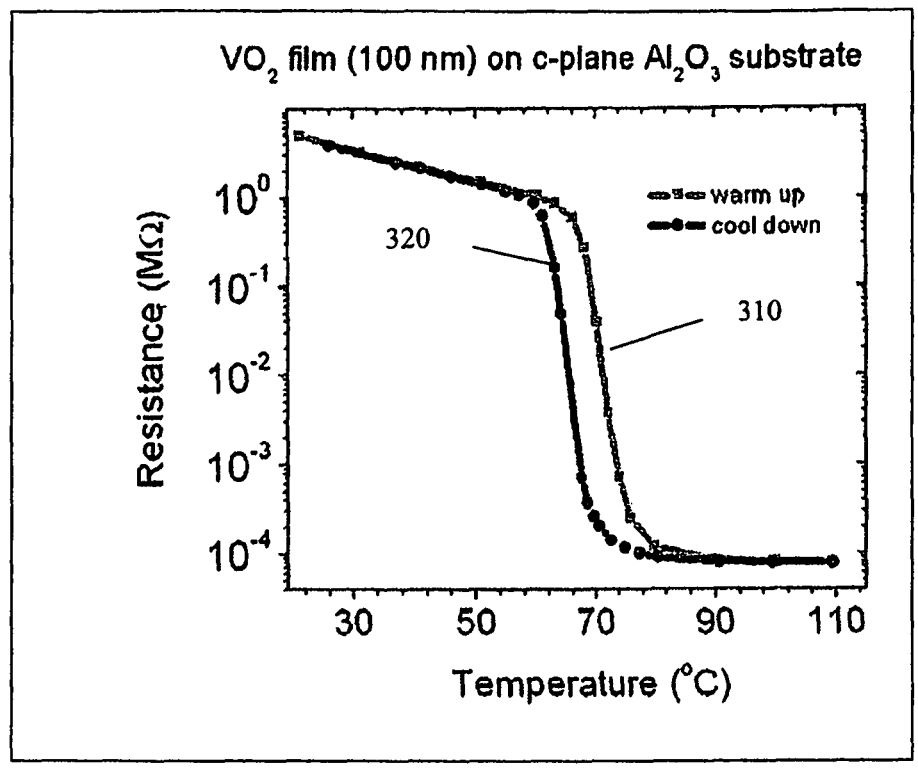
FIG. 3 illustrates the electrical resistance of a 100 nm $VO_2$ film, synthesized from a V target, across the metal-insulator transition.
Figure 4:
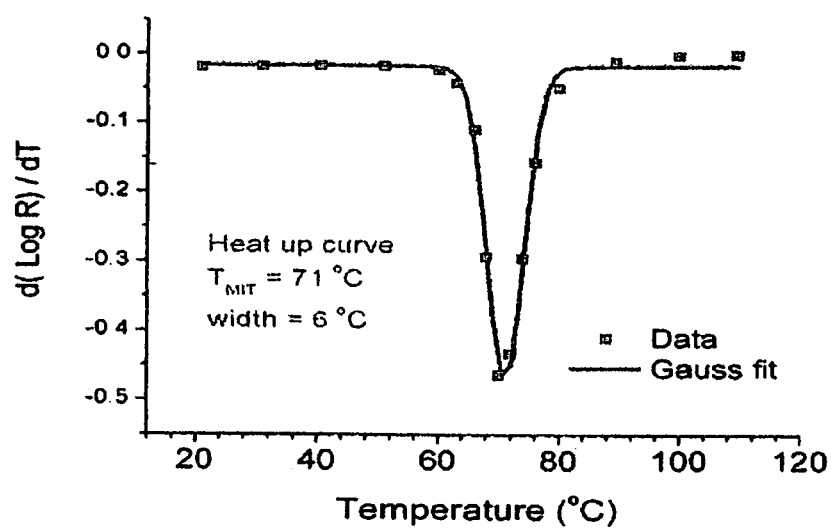
FIG. 4 illustrates the temperature derivative of the Log R curve on the warm up curve shown in FIG. 3.

FIG. 3 and FIG. 4 illustrate studies carried out with thin films of vanadium dioxide that were synthesized by the reactive sputtering of a vanadium (V) target, as described above.

FIG. 3 illustrates the electrical resistance of a $VO_2$ thin film on a c-plane $Al_2O_3$ substrate, across the metal-insulator transition. The heat-up (or warm-up) curve is labeled 310, and the cool down curve is labeled 320. In the embodiment illustrated in FIG. 3, the electrical resistance of the film is measured by contacting the surface of the film with 2 probes separated by approximately 3 mm. The temperature of the probe station table with the sample is controlled in the 25 to 120° C. range to allow the measurements of the electrical resistance temperature dependence.

In FIG. 3, a clear and extremely high metal insulator transition is observed at around 70. As seen in FIG. 3, the resistance changes by about four orders of magnitude upon the MIT, which is comparable to the best reported MIT values in single crystals and epitaxial films.

The synthesis methods and systems described above thus yield polycrystalline thin films which have a promising potential in electronics applications. By comparison, single crystal samples suffer breakages upon multiple cycling across the MIT, and epitaxial films are expensive to make and their epitaxial nature requires additional testing, for example by x-ray analysis.

FIG. 4 illustrates the temperature derivative of the Log R curve on heat-up (shown in FIG. 1), which is used to determine the MIT parameters of the vanadium dioxide thin film. In FIG. 4, the d(Log R)/dT data are fitted with a Gaussian whose center and width are taken as the MIT parameters, namely temperature and width. In the embodiment illustrated in FIG. 4, $T_{MIT}$=71° C., and width=6° C. These parameters show that the synthesized thin film can be used in electrical and optical switches and modulators.

In sum, the synthesis and functional properties of thin vanadium dioxide films, synthesized by RF sputtering from a $VO_2$ target, have been discussed. The metal-insulator transition is clearly seen. Studies of how synthesis conditions affect MIT parameters are discussed in detail in the '308 provisional application and the '448 provisional application, both of which are incorporated by reference in their entireties. Thinner films are found to have considerably improved MIT parameters, whereas no lateral size dependence is observed in $VO_2$ devices scaled down to 20 μm. Strong dependence of the MIT parameters on the substrate temperature during the deposition was observed. The MIT transition width varied non-monotonously with the substrate temperature.

The MIT in these $VO_2$ thin films can be used in fast switching electronic and electro-optic devices. Potential applications of ultrafast phase transitions include highly scaled logic and memory devices, including but not limited to switches, and optical modulators.

II. Effect of Ultra-Violet Irradiation on Electrical Resistance and Phase Transition Characteristics of Thin Film Vanadium Oxide As described above, the synthesis of good quality $VO_2$ films involves high (above 300° C.) fabrication temperatures. This complicates lithographic patterning of $VO_2$ into devices using common photo- and e-beam sensitive resists and deteriorates interfaces due to enhanced diffusion. Low temperature synthesis techniques are preferable for the purpose of incorporating the material in nanoscale devices and also for heterogeneous integration. Therefore improved methods of oxidation of vanadium and its oxide phases need to be explored.

UV radiation during oxidation of thin metal films has been shown to enhance the oxidation process, resulting in high-quality oxide layers at room temperature.

In one or more embodiments of the present disclosure, UV radiation is used to enhance the oxidation kinetics of vanadium oxide, even at near-room temperature. This opens up the possibility of tuning the oxidation process to obtain phase-pure $V_{O2}$ films by low-temperature methods.

Figure 5:
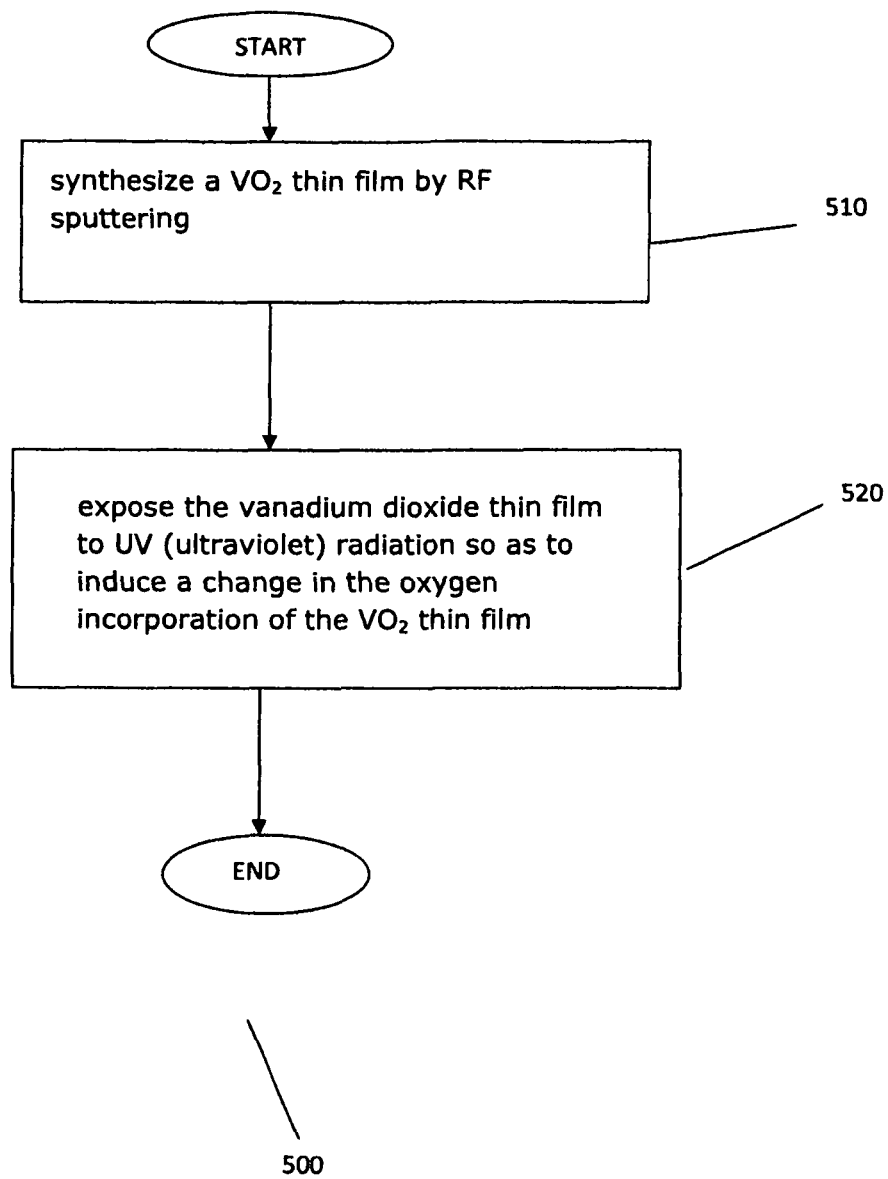
FIG. 5 illustrates a schematic flow chart of a method of controllably varying the stoichiometry of a $VO_2$ thin film using UV radiation, in one embodiment of the present disclosure.

FIG. 5 illustrates a schematic flow chart of a method 500 of controllably varying the stoichiometry of a $VO_2$ thin film using UV radiation, in one embodiment of the present disclosure. In overview, the method 500 includes an act 510 of synthesizing a vanadium dioxide thin film by RF sputtering. The method 500 further includes an act 520 of exposing the vanadium dioxide thin film to UV (ultraviolet) radiation so as to induce a change in oxygen incorporation of the vanadium dioxide thin film.

Figure 6:
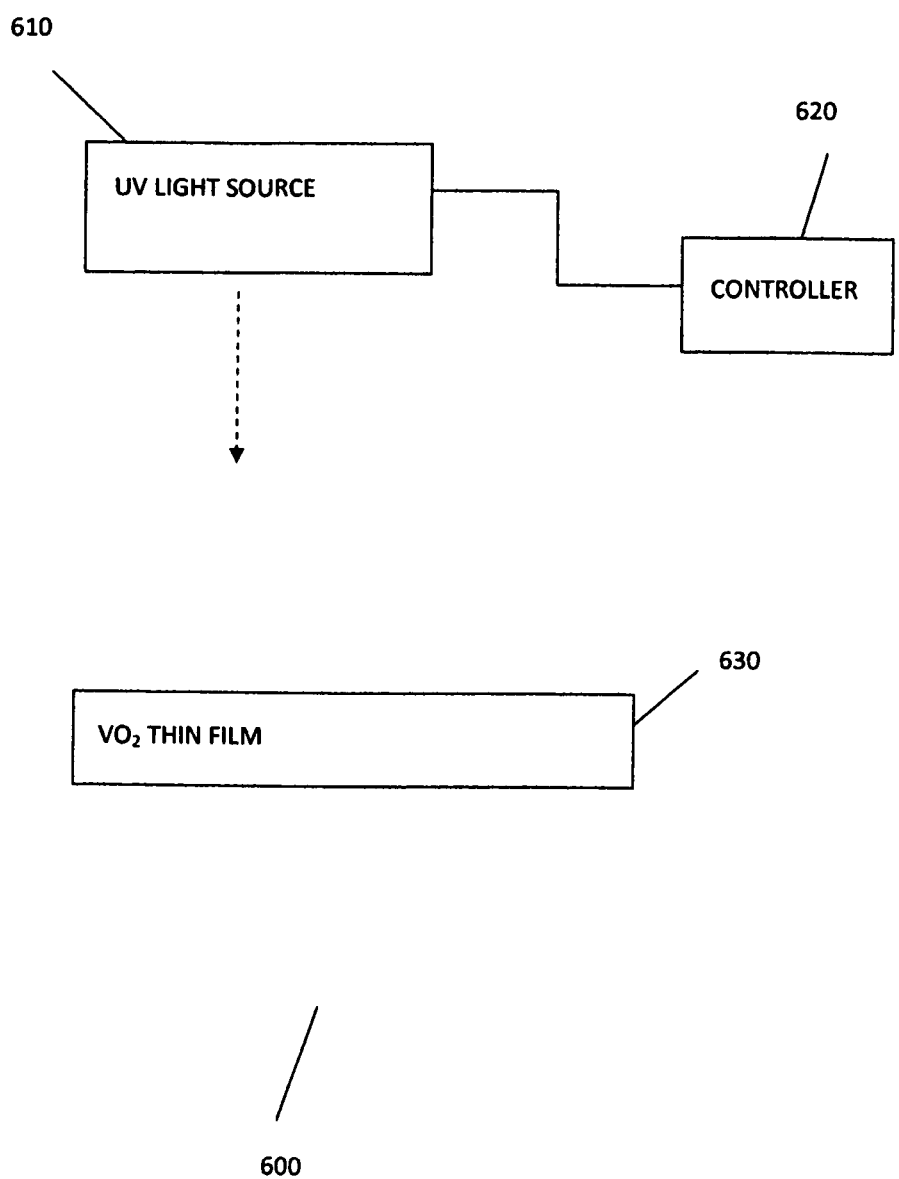
FIG. 6 illustrates a schematic block diagram of a system for varying the stoichiometry of a vanadium dioxide thin film, in one embodiment of the present disclosure.

FIG. 6 illustrates a schematic block diagram of a system 600, in accordance with one or more embodiments of the present disclosure. The system 600 includes a UV light source 610 configured to generate UV light, and a vanadium dioxide thin film 630. The system 600 further includes a controller 620 configured to apply UV light from the UV light source onto the vanadium dioxide thin film, so as to controllably vary the stoichiometry of the thin film 630.

Figure 7:
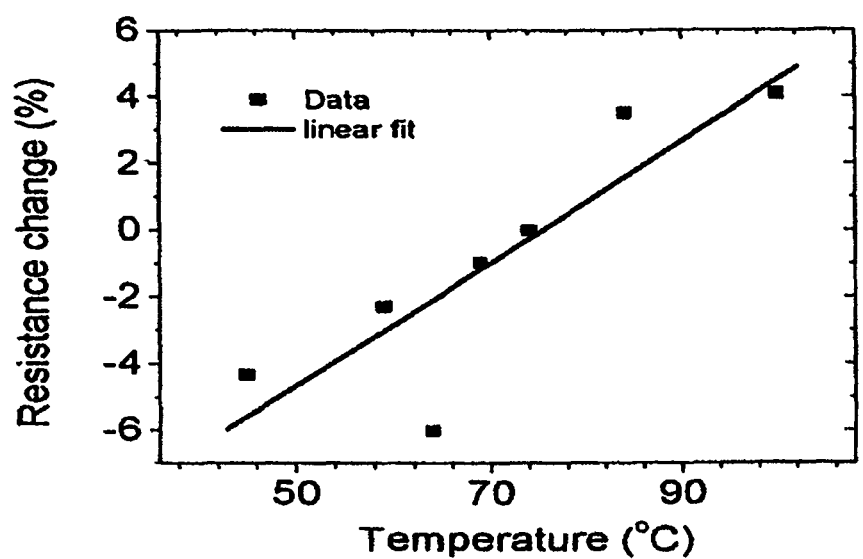
FIG. 7 illustrates the resistance change of a vanadium oxide thin (60 nm) film after the film was exposed to UV radiation.

FIG. 7 illustrates the resistance change of a vanadium oxide thin (60 nm) film after the film was exposed to UV radiation. The UV light affects only a few nanometer layer near the surface of the film, i.e., a small fraction of the whole film. The observed clear resistance difference outlined by a straight line fit evidences a significant change in the electrical resistance of the UV-affected material, demonstrating the possibility to control the oxidation process with UV radiation.

In one approach, an oxygen-deficient VO compound sputtered reactively from a V target in a gas mixture of 86% Ar+14% air was used as a start, while 16% air was considered to be optimal to stabilize $VO_2$ phase [as for the sample in FIG. 6(b)]. The resistance curve for this sample, a thin (60 nm) film on sapphire, shows a weak MIT transition on an overall semiconducting background (decreasing with increasing temperature). Then the film was exposed to UV radiation for 100 min at 45° C. at atmospheric pressure. The resistance change after the exposure with respect to the original R versus T curve is shown in FIG. 7.

A clear change of the resistance is seen, which implies an oxidation enhancement caused by the UV exposure even near room temperature, whereas as was stated above, without UV, the resistance curves were stable with time in ambient environment. The observed change in the resistance may be explained by the addition near the surface of the film of an oxidized layer which does not exhibit MIT and therefore flattens the overall R versus T curve, being negative below the transition and positive above. This argument agrees well with the reasoning above ascribing the deterioration of the MIT sharpness in thin films to the presence of different stoichiometric VOx phases. Given that the thickness of the additionally oxidized layer is expected to be only a few nanometers, it is interesting to note that it produces such a noticeable change in the resistance of a 60 nm film. Using the resistance change as feedback, one may attempt to optimize the UV-enhanced oxidation procedure in order to obtain phase pure $VO_2$ in a similar manner as reactive oxidation parameters during sputtering were optimized to obtain $VO_2$ films [e.g., see FIG. 6(b)].

The stoichiometry of thin film $VO_2$ is easily deviated by small changes in synthesis parameters such as substrate temperature and ambient conditions due to the co-existence of numerous second phases including $V_2O_3$, $V_6O_{13}$ and Magneli phases ($V_nO_{2n-1}$ where $3<n<7$) originating from the multi-valency of vanadium ion and the complex defect oxide structure. The deviation from stoichiometry results in the degradation in the MIT parameters such as transition resistance (or resistivity) ratio, pr, given by the ratio between resistances of insulator and metal phases and MIT temperature, $T_{MIT}$.

While the optimized synthesis conditions for vanadium oxide thin films and the related transport and structure properties have been investigated widely, the same cannot be said for post-deposition approaches to improve the MIT characteristics.

In one or more embodiments of the present disclosure, systems and methods are described that perform post-deposition treatment of vanadium oxide with ultra-violet (UV) radiation, at relatively low temperatures (<250° C.), is described. It is shown that such a treatment can significantly alter the electrical resistance properties by controllably tuning the stoichiometry. UV photons can be employed to induce a significant change in oxygen incorporation in comparison with natural oxidation by creation of highly reactive atomic oxygen and ozone. The present disclosure presents a systematic study of the effect of UV irradiation on varying stoichiometry vanadium oxide thin films in terms of representative electrical transition properties, $\rho_r$, $T_{MIT}$ and hysteresis. The effect of photon irradiation was also studied as a function of temperature ranging from 25° C. to 200° C. to elucidate kinetic effects.

In some embodiments of the present disclosure, thin films of vanadium oxide may be deposited on polished (0001) $Al_2O_3$ substrates by reactive sputtering from V target in varying oxygen flow rates. The substrates may be pre-annealed at 550° C. for 30 minutes and nearly 50 nm thick films were grown. Systematic UV irradiation studies may be performed in an environmental probe station with custom-designed UV sources configured to emit UV photons having wavelengths of 185 nm and 254 nm. It should be understood that other embodiments may use UV source configured to emit UV light of different wavelengths.

The temperature vs. resistance curves may be acquired by current-voltage measurements with two terminal contacts in the range of 25~100° C. that includes the phase transition boundary (~67° C.) Four representative sets of samples may be chosen, and are referred to in the present disclosure as LO (Lightly O-rich), ST (Stoichiometric), LV (Lightly V-rich), and HV (Heavily V-rich) prepared with different oxygen percent during sputtering ranging from 7.8 to 6.3% (remainder $A_r$) respectively.

The change in MIT properties as a function of UV exposure time, $t_{UV}$, may be investigated, in varying stoichiometry vanadium oxide thin films. UV radiation may be shone on samples directly from a Hg vapor lamp at 25° C. in an environmental probe station.

Figure 8A:
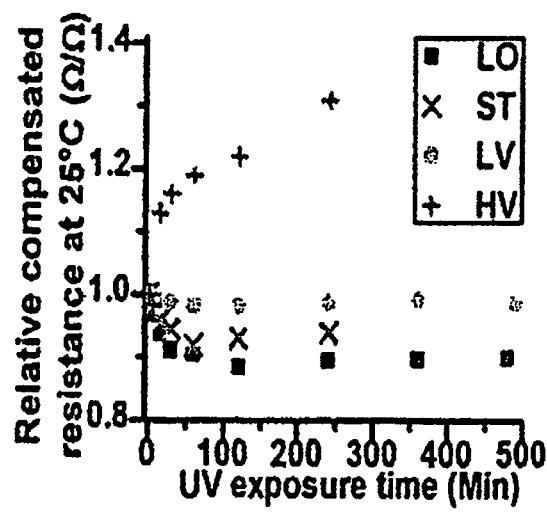
FIG. 8A shows the relative compensated resistance at 25° C. versus the UV exposure time, $t_W$.
Figure 8B:
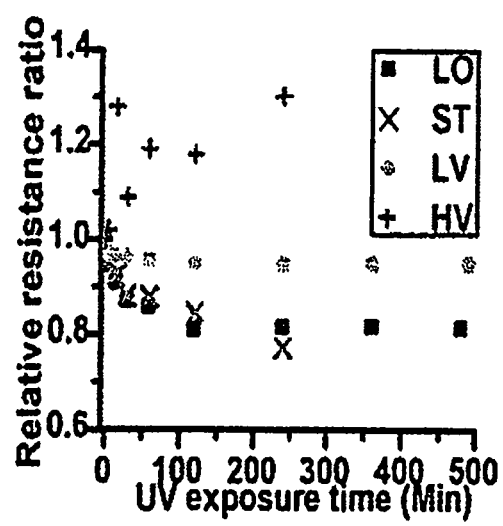
FIG. 8B shows the relative resistance ratio versus the UV exposure time $t_W$.

In FIGS. 8A and 8B, the UV-assisted changes in electrical properties are analyzed in terms of the relative $R_{25}$ and $R_{100}$ denoted as $R_{r25}$ and $R_{r100}$ respectively. $R_{r25}$ is defined as $R_{r25}=R_{25wUV}/R_{25woUV}$ where $R_{25wUV}$ is $R_{25}$ with UV oxidation and $R_{25woUV}$ is the initial $R_{25}$ before UVO and $R_{r100}$ is defined in the same way. Before employing these parameters, the degradation and hysteresis effects mentioned above were ruled out from $R_{r25}$ to consider only the influence of UV oxidation. The ratio of change in resistance by UV oxidation is defined as $Y_{UV}=R_{r25}-R_{i25})/R_{i25}$ where $R_{i25}$ and $R_{f25}$ are $R_{25}$ before and after UVO respectively. The compensated resistance at 25° C., $CR_{25}$, is given as $CR_{25}=R_{25woUV}(1+\gamma_{UV})$. A set of $CR_{25}$ values at different UV exposure times can be obtained by repeating this procedure.

FIG. 8A shows the relative compensated resistance at 25° C. versus the UV exposure time, $t_{w}$. In other words, FIG. 8A shows the changes in relative $CR_{25}$, $CRr_{25}=CR_{25}/R_{25woUV}$ of all samples. In the case of LO sample, CRr25 may decrease due to the formation of V-deficient V6O13 phase that is metallic at room temperature (RT) whereas that of HV increased likely due to the decrease in concentration of interstitial cations that contribute to the high conductivity of Magneli phases at low temperature. $CR_{r25}$ does not change significantly in both ST (<~5%) and LV (<~1%) by UV exposure for long times (>240 minutes) and in the case of ST, this result corresponds well with previous studies, identifying the maximum resistance plateau around stoichiometric VO2. An increase in $CR_{r25}$ for LV sample is not observed. The trend of $R_{r100}$ alteration with UV matches reports indicating that the sample with higher oxygen content has the higher resistance of tetragonal phase, especially in the O-rich region.

FIG. 8B shows the effect of UV on the relative pr defined as $CR_{r25}/R_{r100}$. The $\rho_r$ of HV increased with $t_{UV}$ while those of the others decreased. These trends are likely to be related with the fact that $\rho_r$ decreases as the deviation from stoichiometry increases. $T_{MIT}$ has a maximum value at ideal stoichiometry because both O-rich and V-rich phases have lower transition temperature than stoichiometric phase. Therefore the shift of $T_{MIT}$ reflects in the alteration of stoichiometry. $T_{MIT}$ and MIT width, $w_{MIT}$, were determined respectively as the center and half width of the Gaussian peak fitting to the derivative of $Log_{10}$ (resistance) with temperature in each heating curve. The pristine $T_{MIT}$ before any UV exposure of LO, ST, LV and HV samples are 72.5, 73.3, 73.1, and 68.2° C. correspondingly. $T_{MIT}$ in ST showed clear decrease reflecting the formation of lower $T_{MIT}$ phases. The MIT width increases with oxygen deficiency: $w_{MIT}$ of LO, ST, LV, and HV are 4.7, 5.3, 7.9, and 15.4° C. respectively.

The temperature-dependent oxidation kinetics under UV irradiation have also been studied, as well as temperature vs. resistance curves of ST and HV samples, and have been described in the '308 provisional application and the '448 provisional application, which are incorporated by reference in their entireties.

These studies that the electrical resistance and phase transition characteristics of thin film vanadium oxide can be modulated at low temperatures (<250° C.) using photon-assisted oxidation and resulting changes in oxygen stoichiometry. Temperature dependent photon irradiation studies along with transport measurements indicate kinetics consistent with that expected for low temperature oxygen incorporation into oxides. It is anticipated that these results may be of potential relevance to synthesis of thin film oxides with desirable functional properties.

In sum, the present disclosure describes systems and methods for modulating the resistance ratio across the metal-insulator transition, as well as the resistance, of VO2 thin films at relatively low temperatures, by the use of ultra-violet (UV) irradiation. The enhanced oxygen incorporation due to the creation of excited oxygen species enables controllably tunable stoichiometry.

The components, steps, features, objects, benefits and advantages that have been discussed are merely illustrative. None of them, nor the discussions relating to them, are intended to limit the scope of protection in any way. Numerous other embodiments are also contemplated, including embodiments that have fewer, additional, and/or different components, steps, features, objects, benefits and advantages. The components and steps may also be arranged and ordered differently.

Nothing that has been stated or illustrated is intended to cause a dedication of any component, step, feature, object, benefit, advantage, or equivalent to the public. While the specification describes particular embodiments of the present disclosure, those of ordinary skill can devise variations of the present disclosure without departing from the inventive concepts disclosed in the disclosure.

While certain embodiments have been described of systems and methods relating to vanadium oxide thin films, it is to be understood that the concepts implicit in these embodiments may be used in other embodiments as well. In the present disclosure, reference to an element in the singular is not intended to mean "one and only one" unless specifically so stated, but rather "one or more." All structural and functional equivalents to the elements of the various embodiments described throughout this disclosure, known or later come to be known to those of ordinary skill in the art, are expressly incorporated herein by reference.

What is claimed is:

1. A method comprising:
   placing a substrate in a sputtering chamber and heating the substrate prior to sputtering;
   placing a VO$_2$ target material in a sputtering gun inside the sputtering chamber, the target material including a crystalline oxide;
   introducing into the sputtering chamber an inert gas at a first flow rate, then a reactive gas at a second flow rate;
   applying a voltage within the sputtering chamber to create a plasma within the sputtering chamber;
   activating the sputtering gun at a distance from the substrate so as to cause the crystalline oxide in the target material to react with the reactive gas, and so as to cause a layer of a compound of the reactive gas and the crystalline oxide to be deposited on the substrate, thereby creating a single stoichiometric phase, polycrystalline VO$_2$ thin film;
   keeping the substrate at a temperature between 300° C. and 550° C. during sputtering, and cooling down the deposited VO$_2$ thin film to a temperature of about 150° C. after the deposition;
   wherein the first flow rate is 29 sccm and the second flow rate is 7.8 sccm, so that the ratio of vanadium to oxygen in the thin film allows the thin film to undergo a metal-insulator transition (MIT) of four orders of magnitude in resistance at an MIT temperature between 61° C. and 71° C.

2. The method of claim 1, wherein the target material comprises vanadium dioxide.

3. The method of claim 1, wherein the target material comprises vanadium.

4. The method of claim 1, wherein the substrate is at least one of: a S$_i$/S$_i$O$_2$ substrate; and an Al$_2$O$_3$ substrate.

5. The method of claim 1, wherein the inert gas is Ar.

6. The method of claim 1, wherein the reactive gas is O$_2$.

7. The method of claim 1, further comprising the act of maintaining the sputtering gun at a power of about 250 W.

8. The method of claim 1, wherein the distance from the substrate is about 6 inches.

9. The method of claim 1, wherein the sputtering chamber has a base pressure of between about 2×e-08 Torr to about 3×e-08 Torr.

* * * * *